(12) United States Patent
Kim et al.

(10) Patent No.: US 6,740,562 B2
(45) Date of Patent: May 25, 2004

(54) MANUFACTURING METHOD OF A SEMICONDUCTOR DEVICE HAVING A POLYSILICON ELECTRODE

(75) Inventors: Jong-Hwan Kim, Bucheon (KR); Cheol-Joong Kim, Bucheon (KR); Suk-Kyun Lee, Bucheon (KR); Yongcheol Choi, Shiheung (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 0 days.

(21) Appl. No.: 10/094,445

(22) Filed: Mar. 8, 2002

(65) Prior Publication Data

US 2003/0049909 A1 Mar. 13, 2003

(30) Foreign Application Priority Data

Sep. 13, 2001 (KR) .................................. 2001-0056518

(51) Int. Cl.$^7$ .......................................... H01L 21/8258
(52) U.S. Cl. ...................................................... 438/309
(58) Field of Search ................................ 438/309, 312, 438/350, 364, 313, 318, 365, 357; 257/197, 587

(56) References Cited

U.S. PATENT DOCUMENTS 6,211,029 B1 * 4/2001 Kinoshita .................. 438/364
6,287,929 B1 * 9/2001 Kato ......................... 438/364

* cited by examiner

Primary Examiner—Evan Pert
Assistant Examiner—Monica D. Harrison
(74) Attorney, Agent, or Firm—Sidley Austin Brown & Wood LLP

(57) ABSTRACT

A semiconductor device and a method of manufacturing the semiconductor device having a vertical NPN bipolar transistor, a lateral PNP bipolar transistor, and P-type and N-type resistors are disclosed. In one embodiment, a photoresist pattern is formed on a pad oxide layer and field oxides on an N-type epitaxial layer that is grown on a P-type semiconductor substrate. The pad oxide layer is etched after implanting P-type impurity into the epitaxial layer by using the photoresist pattern as a mask. Deposition of a polysilicon layer after removing the photoresist pattern is followed by implanting P-type impurity and N-type impurity into the polysilicon layer in sequence. Another photoresist pattern formed on the polysilicon layer after the previous implantation is used as an etch mask for etching the polysilicon layer to form polysilicon electrodes of transistors and P-type and N-type resistors as well as expose the surface of the epitaxial layer near an emitter region of the vertical transistor. P-type impurity is implanted into the epitaxial layer through the exposed surface thereof by using the photoresist pattern as an implant mask. The structure is then subjected to heat treatment to form emitter, intrinsic and extrinsic base, and collector regions of the transistors.

17 Claims, 22 Drawing Sheets

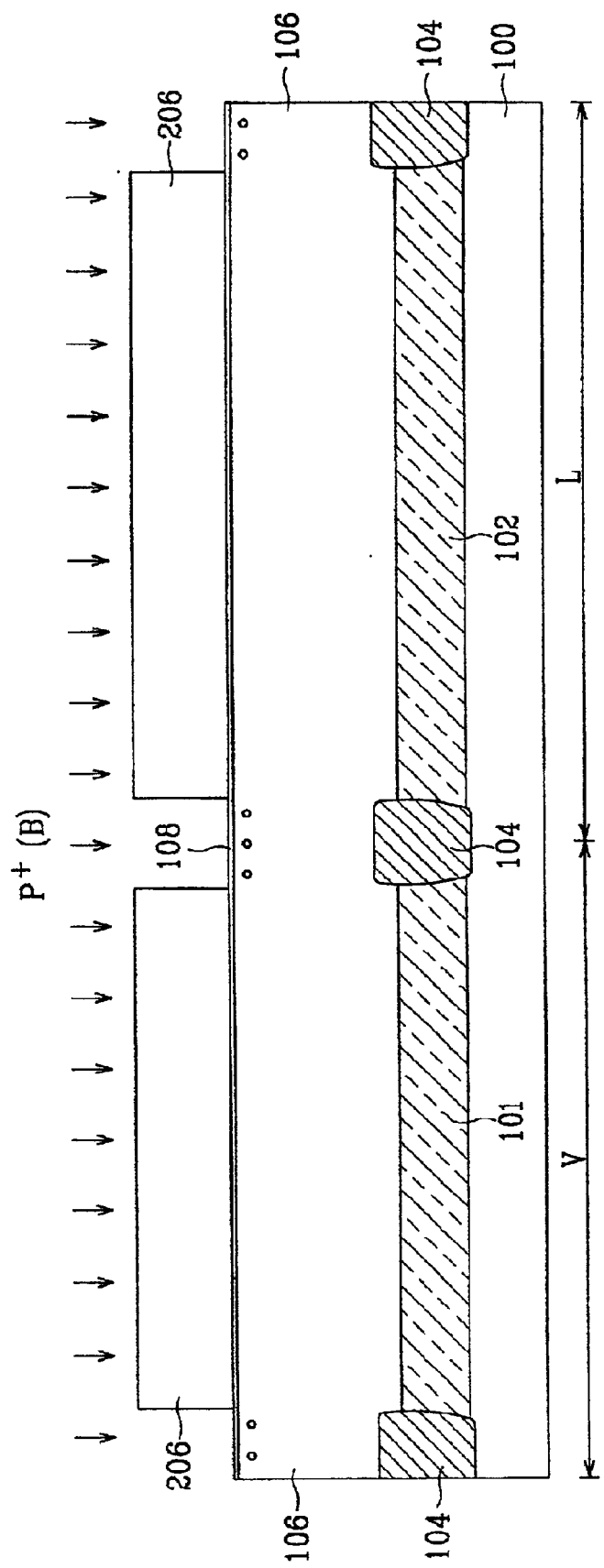

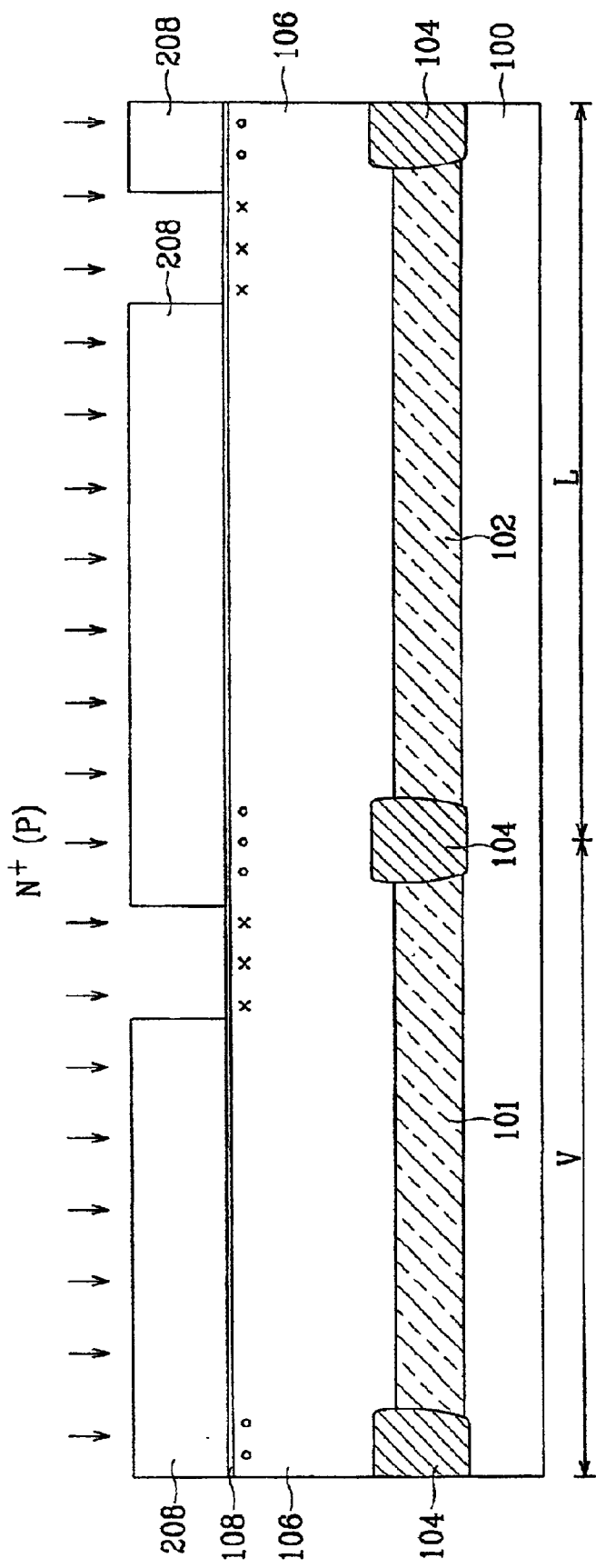

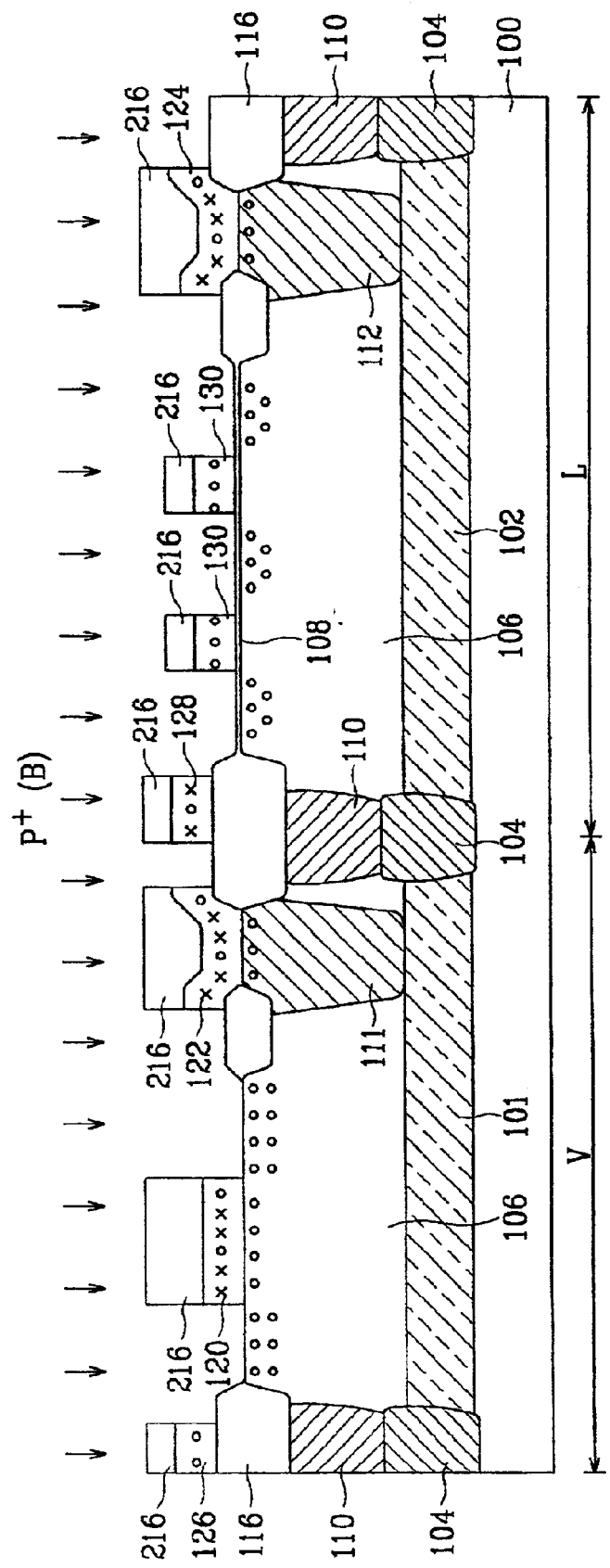

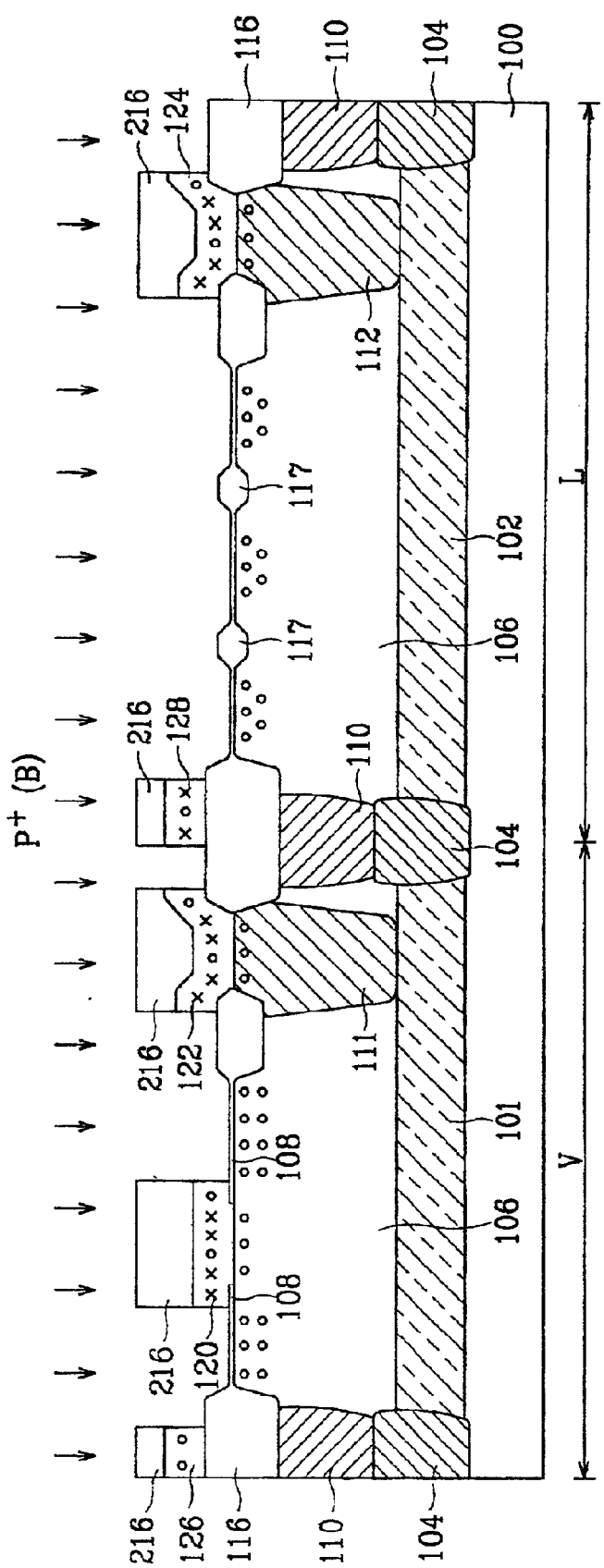

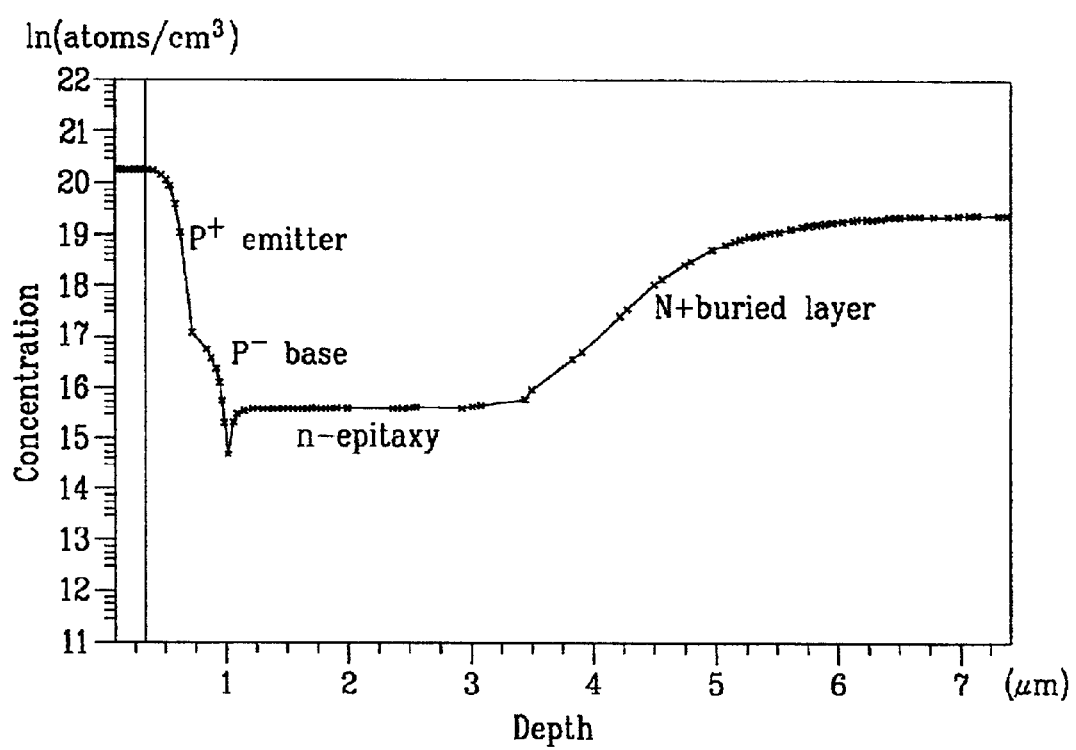

MANUFACTURING METHOD OF A SEMICONDUCTOR DEVICE HAVING A POLYSILICON ELECTRODE

CROSS-REFERENCE TO RELATED APPLICATION

This relates to, and claims priority of, Korean Patent Application No. 2001-0056518, filed on Sep. 13, 2001, the disclosure of which is hereby incorporated by reference.

TECHNICAL FIELD

The present disclosure relates to a semiconductor device and a method of manufacturing the semiconductor device, and more particularly to a method of manufacturing a semiconductor device having a polysilicon electrode.

BACKGROUND

Bipolar transistors having an emitter, a base and a collector formed in a semiconductor substrate may be generally classified into vertical and lateral types based on the moving direction of charge carriers from the emitter. The carriers of a vertical transistor generally flow in a direction perpendicular to a surface of a substrate having the transistor, while those of the lateral transistor flow parallel to the surface. When using a P-type substrate, an NPN transistor is typically a vertical type, while a PNP transistor is typically a lateral type.

N-type and P-type resistors, as well as PNP and NPN transistors, may be generally provided in a single substrate, and the manufacturing method thereof typically requires several photolithography steps. According to one conventional design, when a transistor having a polysilicon emitter electrode and a polysilicon resistor is formed in a single substrate, at least thirteen (13) lithography steps, including a step for forming metal electrodes, are needed.

SUMMARY

In general, according to some embodiments, the present method provides for the manufacture of a semiconductor device with a reduced number of lithography steps and for self-alignment of intrinsic and extrinsic base regions of a vertical bipolar transistor.

According to one aspect, an emitter region and a base region of different conductivity types for a vertical bipolar transistor may be formed simultaneously by counter doping, i.e., implanting two different conductivity type impurities with different doses into a polysilicon layer and diffusing the impurities into a semiconductor body.

According to another aspect, an extrinsic base region may be formed by using a polysilicon emitter electrode or a photoresist pattern thereon as a mask. Specifically, a photoresist pattern is formed on a polysilicon layer over a semiconductor body. The polysilicon layer is then etched by using the photoresist pattern as an etch mask to form a polysilicon electrode, and impurity is implanted or diffused into the semiconductor body using the photoresist pattern as a mask.

According to yet another aspect, a polysilicon electrode and a polysilicon resistor are formed using a single lithography step. A first dose of an impurity of a first conductivity type is implanted or diffused into a polysilicon layer and a second dose of an impurity of a second conductivity type is implanted or diffused into a portion of the polysilicon layer. The polysilicon layer is then patterned to form the electrode and the resistor.

According to still another embodiment, a collector region of a first conductivity type is formed in a semiconductor body of the first conductivity type. After depositing a polysilicon layer on the semiconductor body, a first dose of a first impurity of a second conductivity type is introduced into the polysilicon layer. In addition, a second dose of the second impurity of the first conductivity type is introduced into the polysilicon layer with the second dose being greater than the first dose. By patterning the polysilicon layer, a collector poly and an emitter poly spaced apart from each other are formed. The semiconductor body is then subjected to heat treatment, which forms an emitter region of the first conductivity type under the emitter poly and a base region of the second conductivity type under the emitter region.

The impurity of the second conductivity type may be introduced into the semiconductor layer after forming the emitter poly and before the heat treatment, to form an extrinsic base region after the heat treatment.

The patterning the polysilicon layer may include forming a photoresist pattern on the polysilicon layer, etching the polysilicon layer, introducing the second-conductivity-type impurity into the semiconductor body using the photoresist pattern as a mask, and removing the photoresist pattern.

Pursuant to a particular embodiment, the diffusion rate of the first impurity may be larger than that of the second impurity.

According to yet another aspect, the semiconductor device may have a semiconductor substrate of the second conductivity type disposed under the semiconductor body where the semiconductor body comprises an epitaxial layer. In addition, a buried layer of the first conductivity type connected to the collector region may be provided in the substrate and the epitaxial layer.

The manufacturing method may also include implanting an impurity of the second conductivity type for the base region into the semiconductor body before depositing the polysilicon layer.

The method according to the present invention may also include forming a pad layer on the semiconductor body before forming the collector region. The pad layer may be removed before depositing the polysilicon layer. Alternatively, two contact holes may be formed in the pad layer, exposing portions of the collector region and another portion of the epitaxial layer. In the latter case, the polysilicon layer contacts the epitaxial layer through the contact holes.

In a specific example embodiment, the second dose is about $1.0$–$5.0 \times 10^{14}$ atoms/cm$^2$ and the first dose is about $9.0 \times 10^{15}$–$1.0 \times 10^{16}$ atoms/cm$^2$.

The polysilicon layer may have a first portion which is not subjected to the introduction of the second impurity, and the first portion of the polysilicon layer may become a resistor of the second conductivity type, which is separated from the emitter and the collector poly after patterning the polysilicon layer.

According to another aspect, a method for manufacturing a semiconductor device includes forming a collector region of a first conductivity type in a semiconductor body of the first conductivity type. After depositing a polysilicon layer on the semiconductor body, a photoresist pattern is formed on the polysilicon layer. The polysilicon layer is then etched to form an emitter poly by using the photoresist pattern as an etch mask. A first impurity of a second conductivity type is introduced into the semiconductor body by using the photoresist pattern a mask for an extrinsic base region. After removing the photoresist pattern, an emitter region of the first conductivity type, an intrinsic base region of the second conductivity type, and the extrinsic base region connected to the intrinsic base region are formed.

A second impurity of the second conductivity type may be introduced into at least a first portion of the polysilicon layer before forming the photoresist pattern. Thereafter, a third impurity of the first conductivity type may be introduced into the polysilicon layer except for at least the first portion of the polysilicon layer before forming the photoresist pattern. Then, the etching forms a resistor of the first portion of the polysilicon layer separated from the emitter poly.

According to another aspect, a collector region of the first conductivity type is formed in a semiconductor body of the first conductivity type. Deposition of a polysilicon layer on the semiconductor body is followed by introduction of the second conductivity type impurity into the polysilicon layer without using photolithography. After forming a photoresist pattern covering at least one portion of the polysilicon layer, an impurity of the first conductivity type is introduced into the polysilicon layer using the photoresist pattern as a mask. The photoresist pattern is then removed, and the polysilicon layer is patterned to form a collector poly and an emitter poly of the first conductivity type and a resistor of the second conductivity type, which are spaced apart from one another.

Pursuant to another aspect, a semiconductor device may be manufactured by forming first and second sink regions in a semiconductor body having an insulating layer thereon. The semiconductor body may have vertical and lateral regions where the first and the second sink regions are formed, respectively. A first photoresist pattern may be formed on the insulating layer. The first photoresist pattern may have openings that expose at least a first portion of the insulating layer on a portion of the semiconductor body in the vertical region and second and third portions of the insulating layer on the first and the second sink regions.

The insulating layer is then etched using the first photoresist pattern. Then, after removing the first photoresist pattern, a polysilicon layer is deposited. A first dose of an impurity of second conductivity type is introduced into the polysilicon layer without any lithography mask. A second photoresist pattern is formed that covers at least a first portion of the polysilicon layer. A second dose of an impurity of the first conductivity type is introduced into the polysilicon layer by using the second photoresist pattern as a mask with the second dose being greater than the first dose.

A third photoresist pattern is then formed after removing the second photoresist pattern. The polysilicon layer is then etched using the third photoresist pattern as an etch mask to form first, second and emitter polys and a first resistor of the first conductivity type and a second resistor of the second conductivity type corresponding to the first portion of the polysilicon layer. The first, the second and the emitter polys and the first and the second resistors are spaced apart from one another, and the first and the second polys contacting the first and the second sink regions, respectively. An impurity of the second conductivity type is introduced into the semiconductor body using the third photoresist pattern a mask and then the third photoresist pattern is removed.

The semiconductor body is then heat treated to form an emitter region of the first conductivity type under the emitter poly, an intrinsic base region of the second conductivity type under the emitter region, and an extrinsic base region of the second conductivity type at a periphery of the intrinsic base region.

Details regarding the present apparatus and method may be understood by reference to the following detailed description when read in conjunction with the accompanying drawings.

BRIEF DESCRIPTION OF THE DRAWINGS

FIGS. 4A to 4E are sectional views of the FIG. 3 semiconductor device in the respective manufacturing steps thereof.

FIG. 5 is a graph showing impurity concentration of a vertical NPN transistor of a semiconductor device according to an embodiment of the present invention.

Common reference numerals are used throughout the drawings and detailed description to indicate like elements.

DETAILED DESCRIPTION

Figure 1:
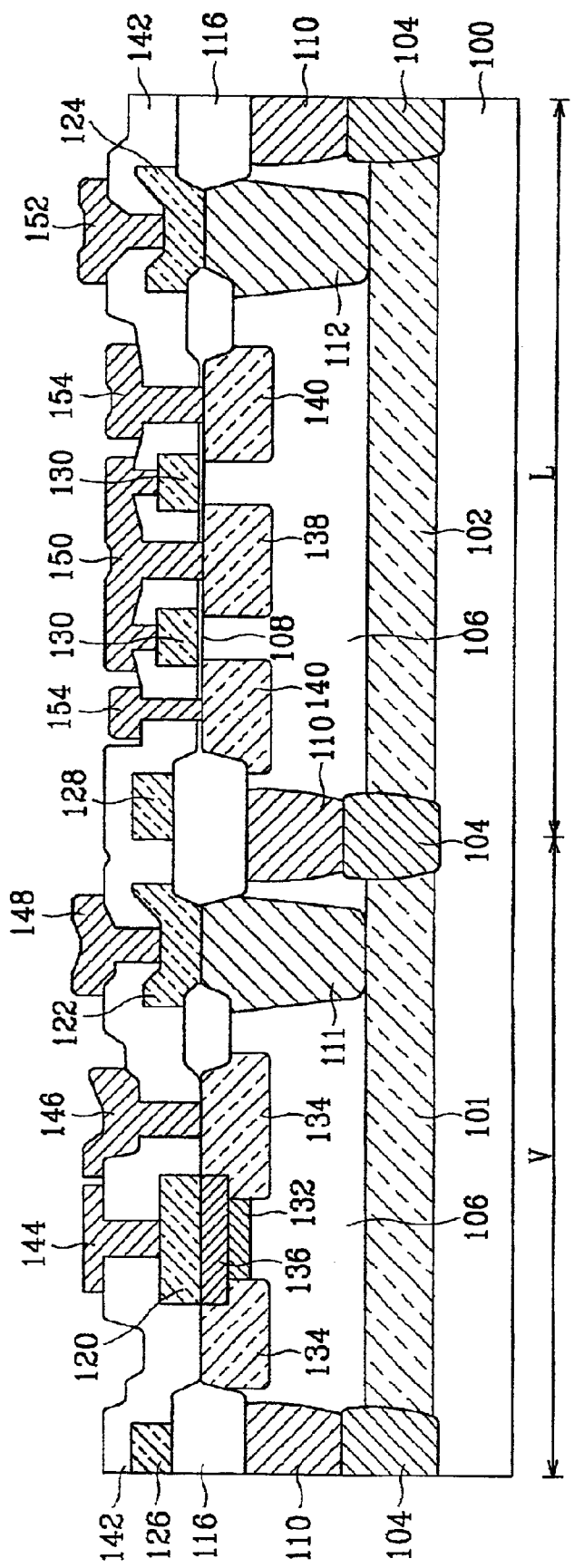
FIG. 1 is a sectional view of a semiconductor device according to one embodiment.

The present apparatus and method now will be described more fully hereinafter with reference to the accompanying drawings, in which embodiments of the apparatus and method are shown. This apparatus and method may, however, be embodied in many different forms and should not be construed as limited to the embodiments set forth herein. In the drawings, the thickness of layers and regions may be exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

In these embodiments, vertical and lateral bipolar transistors and P-type and N-type resistors are manufactured in a single substrate. The types of the vertical and the lateral bipolar transistors are dependent on the conductivity type of the substrate. That is, the types of the vertical and the lateral transistors are NPN and PNP, respectively, when the substrate is P-type, while PNP and NPN, respectively, when the substrate is N-type. The present embodiments are utilizing a P-type substrate.

Figure 2A:
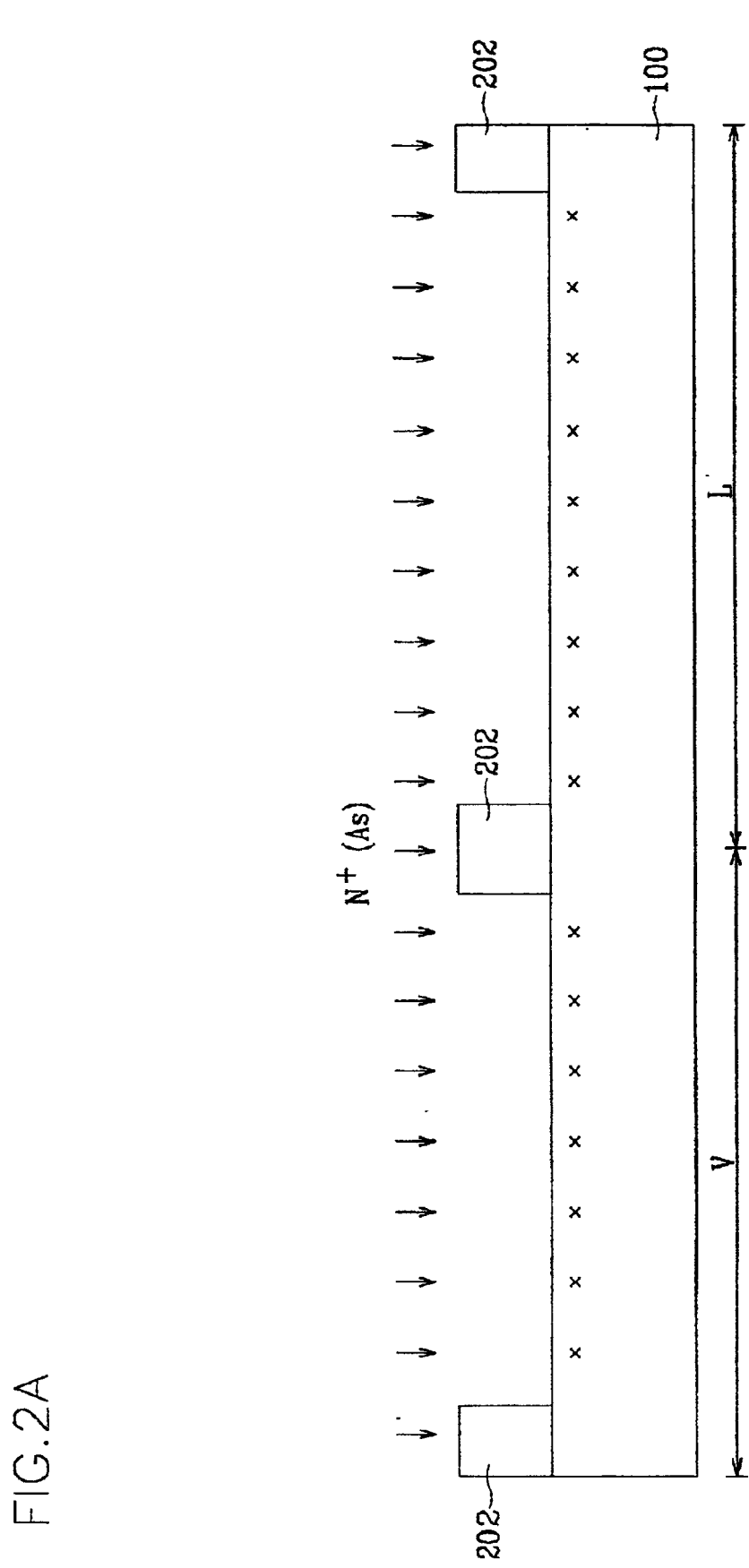
FIGS. 2A to 2N are sectional views of the FIG. 1 semiconductor device in the respective manufacturing steps thereof.
Figure 2B:
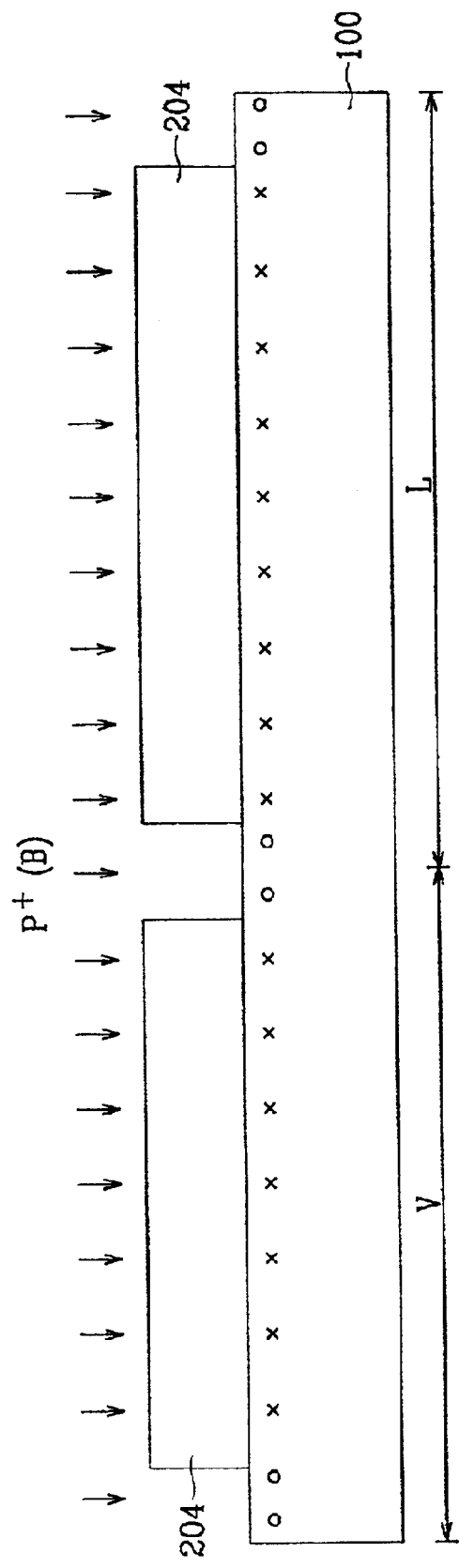
Figure 2C:
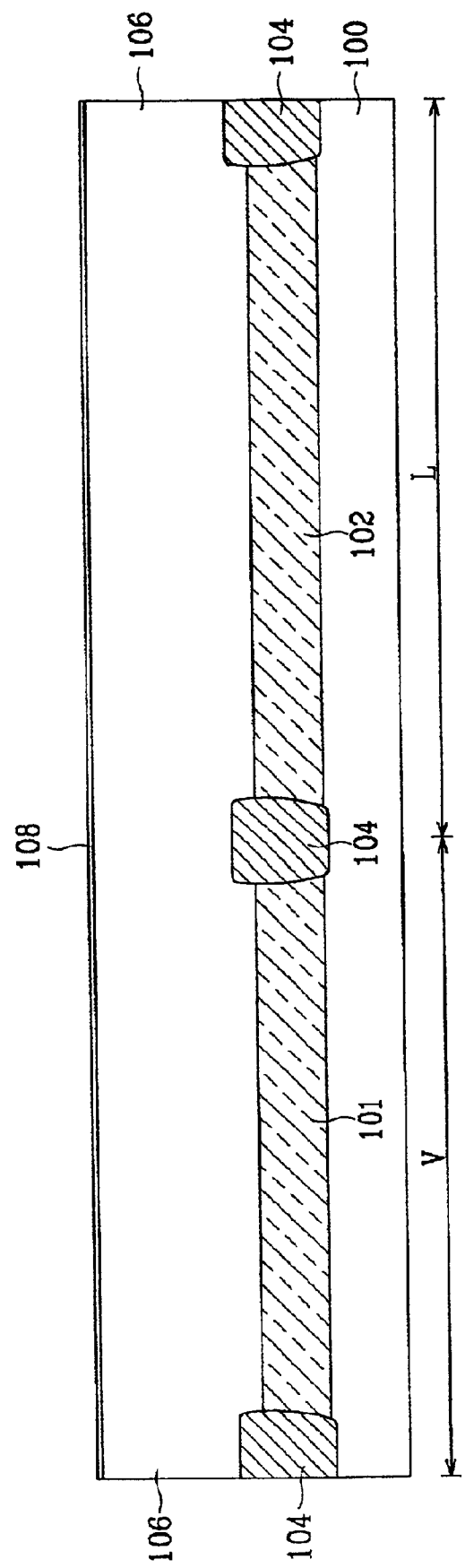
Figure 2F:
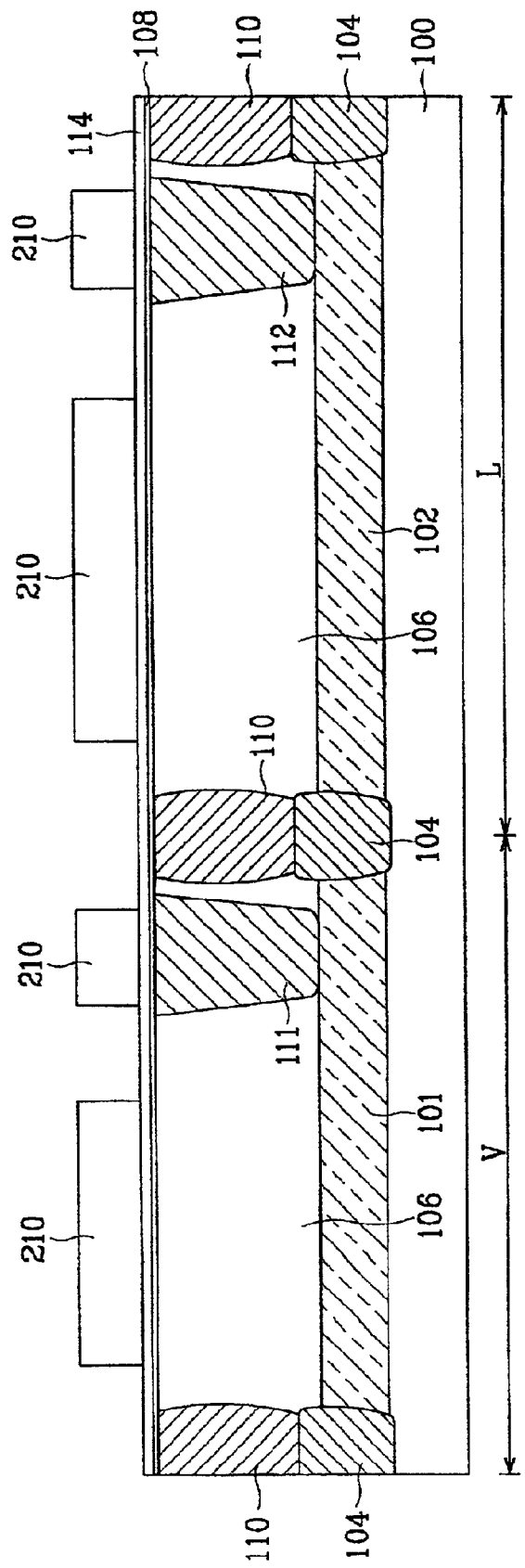
Figure 2G:
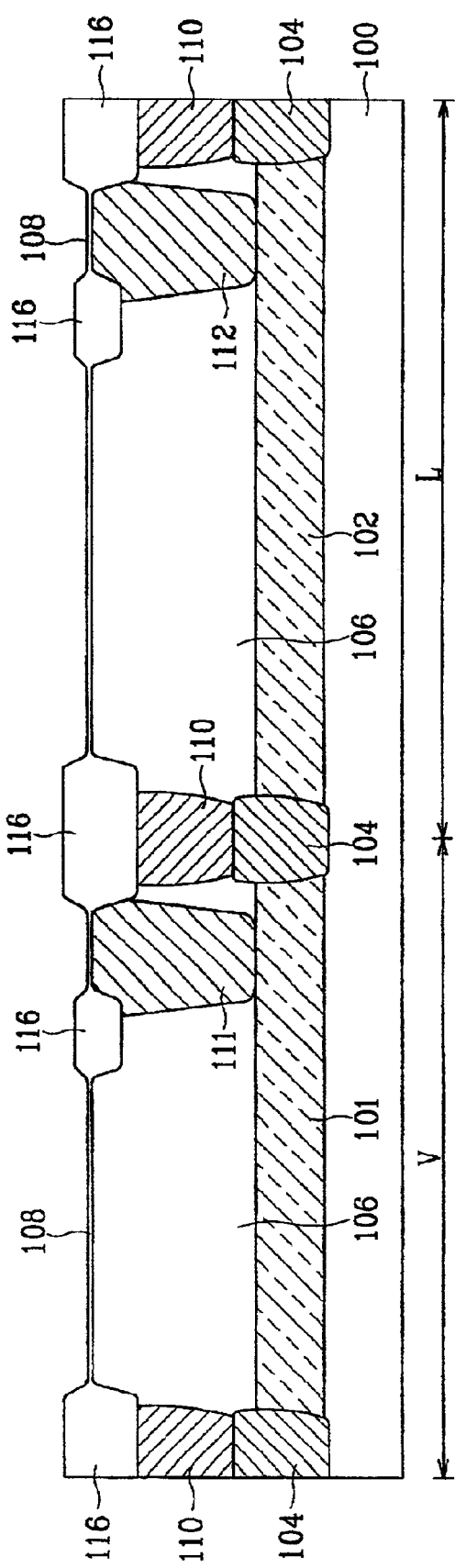
Figure 2H:
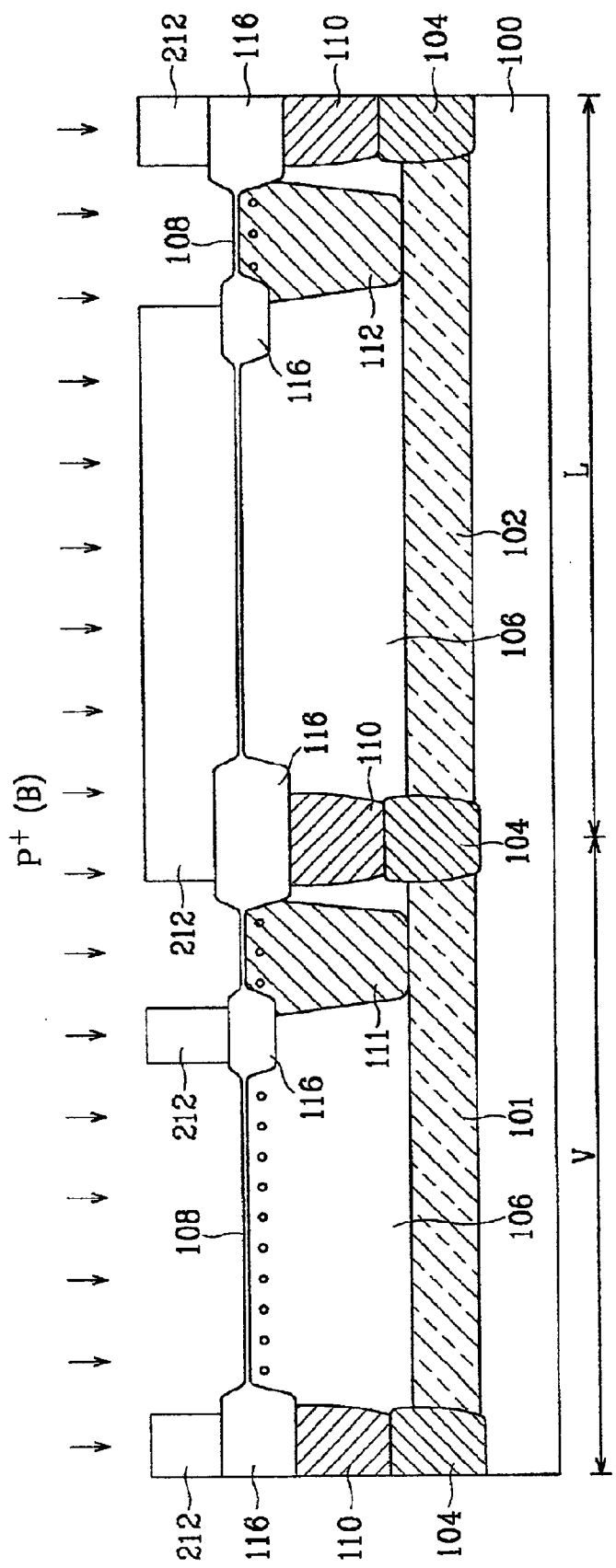
Figure 2I:
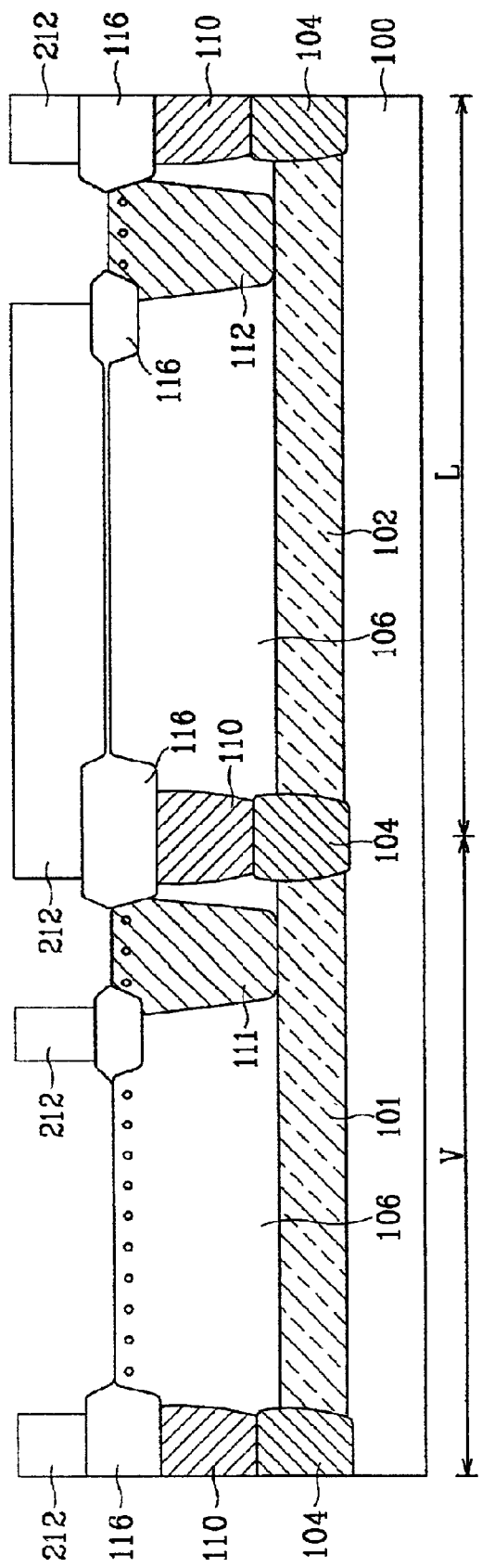
Figure 2J:
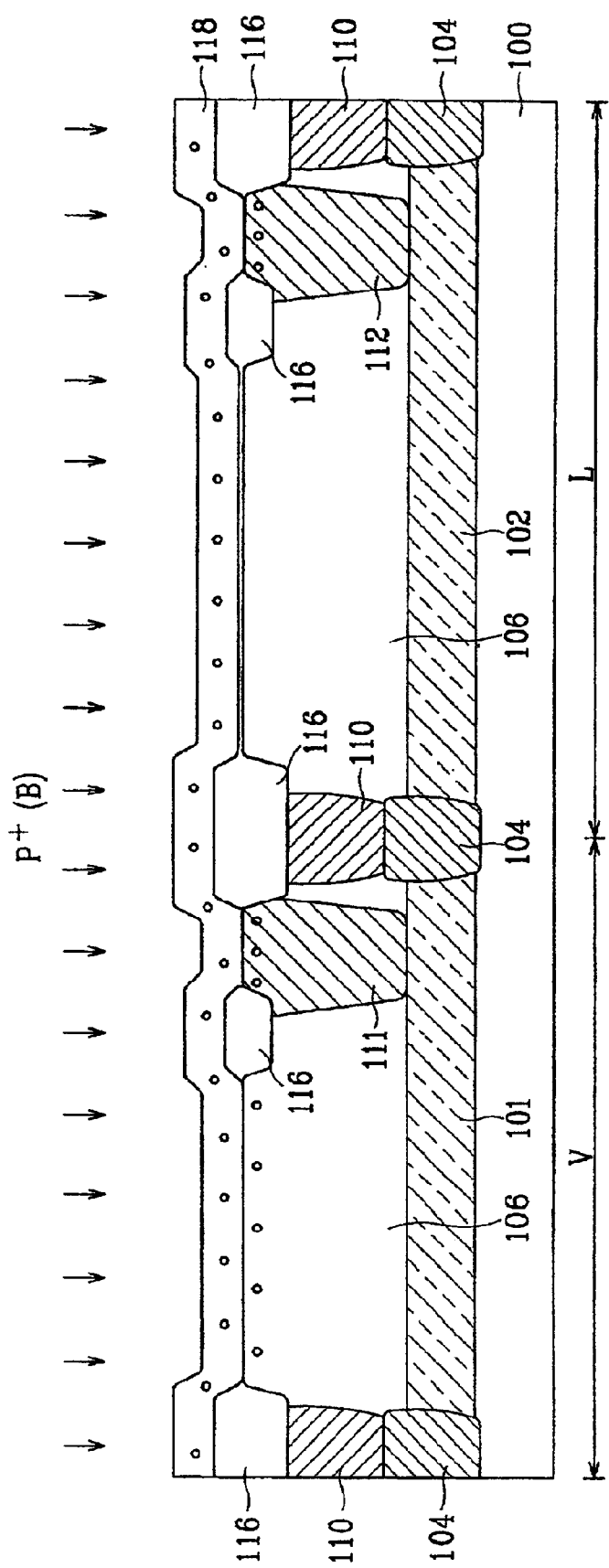
Figure 2K:
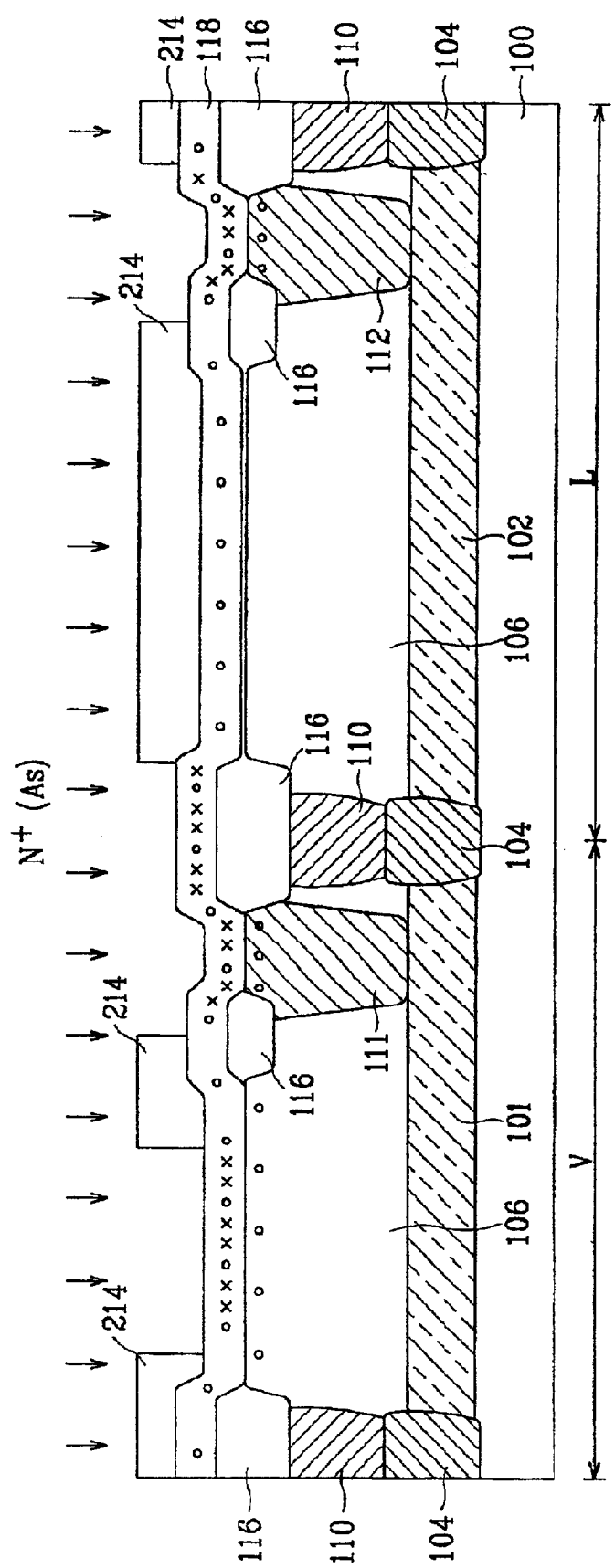
Figure 2M:
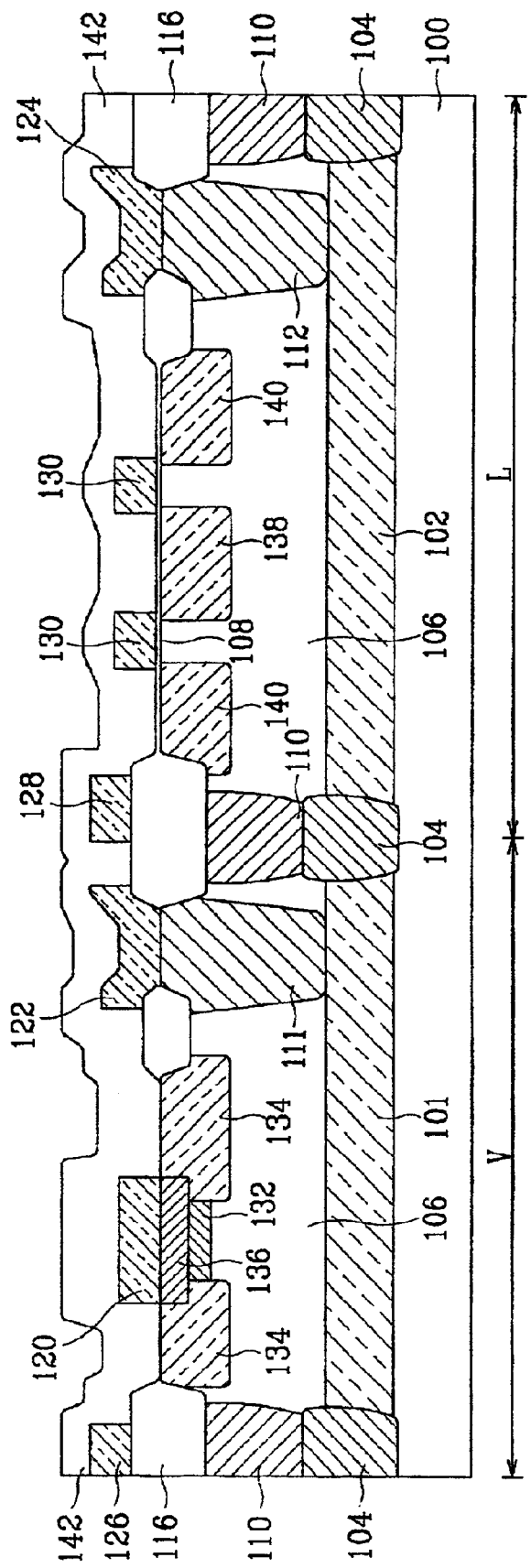
Figure 2N:
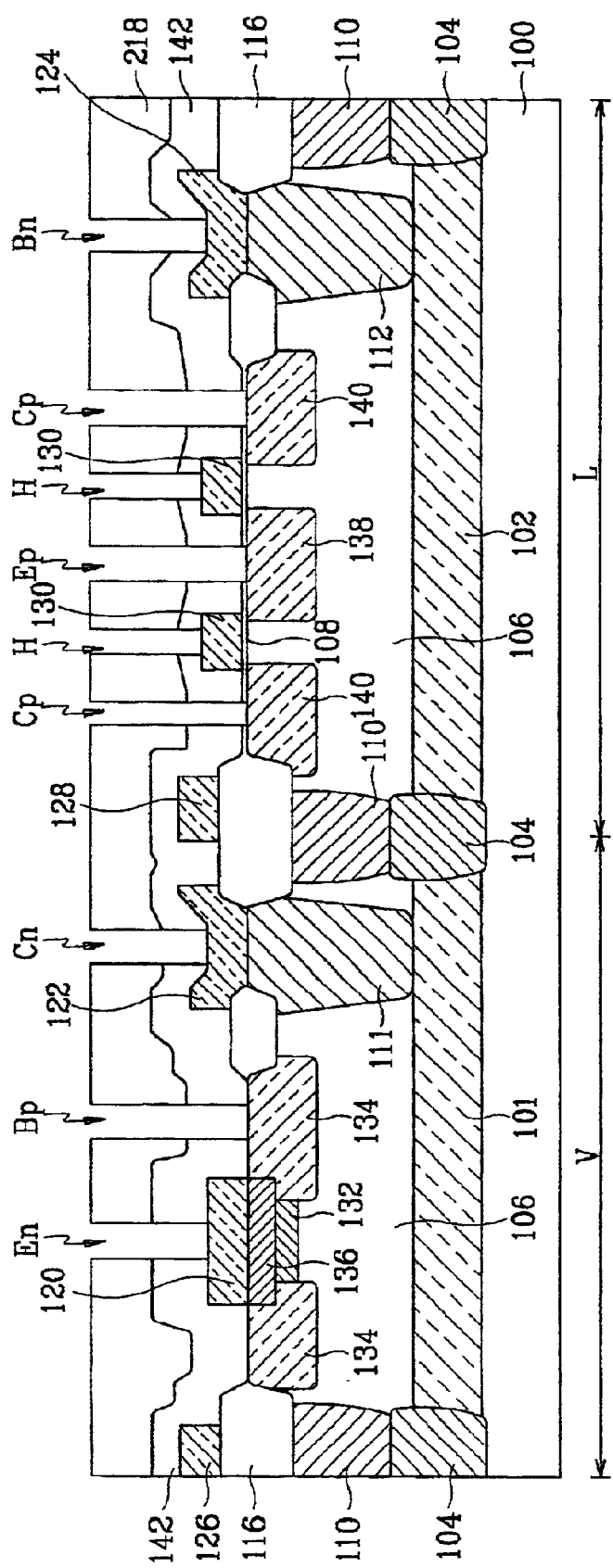

FIGS. 1 and 2A–2N show a semiconductor device and a method for manufacturing the semiconductor device according to one embodiment.

First, a structure of a semiconductor device according to the first embodiment of the present invention will be described with reference to the FIG. 1. For convenience of description, a substrate is divided into two regions, a vertical region V having a vertical NPN bipolar transistor and a lateral region L having a lateral PNP bipolar transistor.

As shown in FIG. 1, an N-type epitaxial layer 106 is provided on a P-type silicon substrate 100. P-type bottom layers or lower isolation regions 104 and two N-type buried layers 101 and 102 are formed between the substrate 100 and the epitaxial layer 106. P-type upper isolation layers 110 extend from a surface of the epitaxial layer 106 to the lower isolation regions 104 formed in the epitaxial layer 106. The isolation regions 104 and 110 are located at the boundaries of the vertical and the lateral regions V and L, and surround the regions V and L so as to separate and electrically isolate the regions V and L. The buried layers 101 and 102 of the vertical and the lateral regions V and L are located between the isolation regions 104.

An N-type sink region or a collector region 111, an N-type emitter region 136, a P-type intrinsic base region 132 and a P-type extrinsic base region 134 are formed in the epitaxial layer 106 of the vertical region V. The regions 111, 134 and 136 extend from the surface of the epitaxial layer 106. The collector region 111 is adjacent the upper isolation region 134 and spaced apart from the regions 132, 134 and 136, and reaches the buried layer 101. The intrinsic base region 132 is located under and contacts the emitter region 136, and the extrinsic base region 134 is located at the periphery of the intrinsic base region 132 and connected thereto.

An N-type sink region or a base region 112, a P-type emitter region 138 and an N-type collector region 140 are formed in the epitaxial region 106 of the lateral region L and extend from a surface of the epitaxial region 106. The base region 112 is separated from the regions 138 and 140 and reaches the buried layer 102. The collector region 140 is separated from the emitter region 138 and, when viewed from the top (i.e., from the side opposite the exterior surface of the substrate 100), surrounds the emitter region 138.

A plurality of field oxides 116 and a pad oxide layer 108 for electrical insulation are formed on the epitaxial layer 106. The field oxides 116 are located at the boundaries of the vertical and the lateral regions V and L, on the isolation regions 110. The field oxides 116 are also disposed between the sink regions 111 and 112 and the impurity regions adjacent thereto, i.e., the extrinsic base region 134 of the vertical region V and the collector region 140 of the lateral region L, respectively. The pad oxide layer 108 is located on a portion of the epitaxial layer 106 between the field oxides 116 in the lateral region L. That is, the portion having the emitter and the collector regions 138 and 140.

A plurality of polysilicon electrodes 120, 122 and 124 are also formed on the epitaxial layer 106 and contact the surface of the epitaxial layer 106 so that they are electrically connected to the impurity regions 136, 111 and 112, respectively. The polysilicon electrodes 120, 122 and 124 comprise an emitter poly 120 and a collector poly 122 contacting the emitter region 136 and the collector region 111, respectively, in the vertical region V, and further comprises a base poly 124 contacting the base region 112 in the lateral region L.

A P-type resistor 126 and an N-type resistor 128 made of polysilicon are provided on the field oxides 116, and a polysilicon pattern 130, located between the emitter region 138 and the collector region 140, is formed on the pad oxide layer 108.

The pad oxide layer 108, the field oxides 116, the polysilicon electrodes 120, 122 and 124, the resistors 126 and 128, the polysilicon pattern 130, and the exposed portions of the epitaxial layer 106 are covered with an insulating layer 142. The insulating layer 142 has contact holes exposing the polysilicon electrodes 120, 122 and 124, the polysilicon pattern 130, and the extrinsic region 134 of the vertical region V. In addition, the insulating layer 142 and the pad oxide layer 108 have contact holes exposing the emitter and the collector regions 138 and 140 of the lateral region L.

An emitter electrode 144, a base electrode 146, and a collector electrode 148 contact the emitter poly 120, the extrinsic base region 134 and the collector poly 122, respectively, via the respective contact holes in the vertical region V formed through the insulating layer 142. In addition, emitter electrode 144, base electrode 146, and collector electrode 148 contact the emitter region 138, the base poly 124 and the collector region 140, respectively, via the respective contact holes in the lateral region L formed through the insulating layer 142.

Now, the manufacturing method of the semiconductor device shown in FIG. 1 according to an embodiment of the present invention is described with reference to FIGS. 2A to 2N. According to this embodiment, ten (10) photolithography steps are sufficient for forming a vertical NPN transistor, a lateral PNP transistor and P-type and N-type resistors.

First, as shown in FIG. 2A, a photoresist pattern 202 is formed on a semiconductor substrate 100 and has an opening in each of the vertical and lateral regions V and L. In this embodiment, the substrate 100 may be made of a monocrystalline silicon and may contain a P-type dopant such as boron (B). The photoresist pattern 202 covers the boundaries of the vertical and the lateral regions V and L so that the openings of the photoresist pattern 202 expose the vertical and the lateral regions V and L, where buried layers 101 and 102 (FIGS. 1 and 2C) will be formed. An N-type impurity of such as arsenic (As) for the buried layers is introduced into portions of the substrate 100 in the regions V and L, through the openings in the photoresist pattern 202, using a conventional technique such as ion implantation or diffusion. The photoresist pattern 202 is used as a mask. When using ion implantation of arsenic, the implantation dose may be about $1-5\times10^{15}$ atoms/cm$^2$, and the implantation energy may be about 80 keV.

As shown in FIG. 2B, a photoresist pattern 204 having a shape reverse, or opposite, to the photoresist pattern 202 shown in FIG. 2A is formed on the substrate 100 after removing the photoresist pattern 202. The photoresist pattern 204 covers the vertical and the lateral regions V and L and has openings exposing the boundaries of the regions V and L, where lower isolation regions 104 (FIG. 1) will be formed. A P-type impurity, such as boron, for the lower isolation layers, is implanted or diffused into the substrate 100 using the photoresist pattern 204 as a mask. In a specific example embodiment, when using implantation of boron, the implantation dose may be about $1-5\times10^{14}$ atoms/cm$^2$, and the implantation energy may be about 80 keV.

As shown in FIG. 2C, the photoresist pattern 204 is removed, and the substrate 100 is then subjected to heat treatment for about 200–500 minutes at about 1,100–1,200 degrees Celsius (° C.) to form N-type buried layers 101 and 102 and P-type lower isolation regions 104. A natural oxide (not shown) which may be formed on the substrate 100 is removed thereafter and an N-type monocrystalline silicon epitaxial layer 106 is grown on the substrate 100.

The epitaxial layer 106 may be grown, for example, by using MOCVD (metal organic chemical vapor deposition) or other suitable methods. The epitaxial layer 106 may be doped during the growth of the epitaxial layer 106 or by using a subsequent separate process. Furthermore, a pad oxide layer 108 for reducing the damage to the substrate 100 caused by succeeding impurity-implantations may be formed on the epitaxial layer 106 during the growth of the epitaxial layer 106. In addition, the buried layers 101 and 102 and the lower isolation region 104 may grow and extend into the epitaxial layer 106 during the growth of the epitaxial layer 106. The height extension of the lower isolation region 104 is shown as being greater than that of the buried layers 101 and 102 since the diffusion rate of boron is typically larger than that of arsenic.

As shown in FIG. 2D, a photoresist pattern 206 having openings is formed on the pad oxide layer 108. The photoresist pattern 206 substantially covers the vertical and the lateral regions V and L. The openings of the photoresist pattern 206 expose portions of the pad oxide layer 108 over the lower isolation regions 104, where upper isolation regions 110 (FIG. 1) will be formed. A P-type impurity is implanted or diffused into the epitaxial layer 106 by using the photoresist pattern 206 as a mask. The P-type impurity may comprise boron or other suitable P-type impurity. Pursuant to an example embodiment, when using ion implantation of boron, the implantation dose may be about $1-5 \times 10^{15}$ atoms/cm$^2$ and the implantation energy may be about 50 keV.

As shown in FIG. 2E, a photoresist pattern 208 is formed on the pad oxide layer 108 after removing the photoresist pattern 206. The photoresist pattern 208 has openings exposing portions of the pad oxide layer 108, where sink regions 111 and 112 (FIG. 1) will be formed. An N-type impurity is then implanted or diffused into the epitaxial layer 106 using the photoresist pattern 208 as a mask. The N-type impurity may comprise phosphorous (P) or another suitable N-type impurity. In one example embodiment, the implantation dose may be about $1-5 \times 10^{15}$ atoms/cm$^2$ and the implantation energy may be about 50 keV.

As shown in FIG. 2F, the photoresist pattern 208 is removed and the substrate 100 is then heat treated for about 200–500 minutes at about 1,100–1,200° C. to form P-type upper isolation regions 110 and N-type sink regions 111 and 112. Thereafter, a silicon nitride layer 114 is deposited on the pad oxide layer 108. The silicon nitride layer 114 may be deposited on the pad oxide layer 108 using chemical vapor deposition (CVD) techniques. A photoresist pattern 210 is formed on the silicon nitride layer 114. The silicon nitride layer 114 has openings exposing portions of the silicon nitride layer 114 at the boundaries of the sink regions 111 and 112 and at the boundaries of the vertical and the lateral regions V and L, where field oxides 116 (FIG. 1) will be formed.

As shown in FIG. 2G, the nitride layer 114 is etched by using the photoresist pattern 210 (FIG. 2F) as an etch mask, and the photoresist pattern 210 is removed. Thereafter, a plurality of field oxides 116 for isolation are thermally grown. The field oxides 116 may be grown using LOCOS (local oxidation of silicon) or other suitable technique. The nitride layer 114 is then removed. Alternatively, instead of using LOCOS, trench processes may be used for insulations.

As shown in FIG. 2H, a photoresist pattern 212 is formed on the pad oxide layer 108 and the field oxides 116. The photoresist pattern 212 has openings exposing portions of the pad oxide layer 108 over the sink regions 111 and 112 and a portion where base regions 132 and 134 (FIG. 1) will be formed. A P-type impurity, such as boron, is implanted or diffused into the epitaxial layer 106 by using the photoresist pattern 212 as a mask. The implantation dose may be about $3.0-8.0 \times 10^{13}$ atoms/cm$^2$ and the implantation energy may be about 50 keV. This step is one of the features of the present method that does not require a separate photolithography process for implanting impurity for an intrinsic base region 132 (FIG. 1). In this step, although the P-type impurity is introduced into the sink regions 111 and 112, the P-type impurity has little effect on the impurity concentration distribution of the sink regions 111 and 112. This is because the implantation dose of this step is significantly less than that of the step forming the sink regions 111 and 112. The implantation in this step is optional, but may be performed for the stability of the device.

As shown in FIG. 2I, the pad oxide layer 108 is etched by using the photoresist pattern 212 as an etch mask. In an example embodiment, the etching technique for this step is a wet etch. A dry etch, however, may alternatively be employed.

As shown in FIG. 2J, a polysilicon layer 118 is deposited after removing the photoresist pattern 212, to contact the central portion of the epitaxial layer 106 in the vertical region V and the sink regions 111 and 112. The deposition of the polysilicon layer 118 may be performed using a CVD technique or other suitable technique. The thickness of the polysilicon layer 118 may be about 2,000–4,000 Å. A silicide layer may be additionally formed on the polysilicon layer 118 to reduce the contact resistance between polysilicon electrodes or resistors and metal electrodes thereon.

A P-type impurity, such as boron, is then implanted or diffused into the polysilicon layer 118 along the length of the polysilicon layer 118. In an example embodiment, when using ion implantation of boron, the implantation dose may be about $1.0-5.0 \times 10^{14}$ atoms/cm$^2$ and the implantation energy may be about 40 keV.

The implantation step of FIG. 2H is omissible since the P-type impurity in the polysilicon layer 118 implanted in this step is introduced into the epitaxial layer 106 of the vertical region V in a subsequent heat treatment step. Although the P-type impurity in the polysilicon layer 118 is also introduced into the sink regions 111 and 112, the P-type impurity has little effect on the concentration distribution of the sink regions 111 and 112 since the implantation dose of this step is significantly less than the implantation dose used when forming the sink regions 111 and 112. It is noted that a separate lithography step for doping a P-type resistor 126 (FIG. 1) is not required, thereby reducing one lithography step.

As shown in FIG. 2K, a photoresist pattern 214, used as a mask for patterning the polysilicon layer 118, is formed on the polysilicon layer 118. The photoresist pattern 214 covers a portion of the polysilicon layer 118, which will become the P-type resistor 126 (FIG. 1). The photoresist pattern 214 has openings exposing portions of the polysilicon layer 118, which will become collector poly 122 (FIG. 1) and base poly 124 (FIG. 1) on the sink regions 111 and 112 of the vertical and the lateral regions V and L, respectively. The photoresist pattern 214 also has openings exposing a portion of the polysilicon layer that will become N-type resistor 128 (FIG. 1) on the field oxide 116 at the boundary between the vertical and the lateral region V and L. An N-type impurity, such as arsenic, is implanted or diffused into the polysilicon layer 118 using the photoresist pattern 214 as a mask. In an example embodiment, the implantation dose may be about $9.0 \times 10^{15}-1.0 \times 10^{16}$ atoms/cm$^2$, and the implantation energy may be about 120 keV. The opening at the portion that will become the emitter poly, and the size of the photoresist pattern 214 at the portion that will become the P-type resistor, may be sized to provide for misalignment margin.

As shown in FIG. 2L, a photoresist pattern 216 is formed on the polysilicon layer 118 after removing the photoresist pattern 214. The photoresist pattern 214 is located near the center of the vertical region V, on the sink regions 111 and 112 of the vertical and the lateral regions V and L, on the field oxide 116 at the boundary of the vertical region V, on the field oxide 116 at the boundary between the vertical and the lateral regions V and L, and at a position inside the lateral region L. The photoresist pattern 216 has openings at the positions where the extrinsic base region 134 (FIG. 1) of the vertical region V, and an emitter region 138 (FIG. 1), and a collector region 140 (FIG. 1) will be formed.

In one example embodiment, portions of the photoresist pattern 216 on the sink regions 111 and 112 may overlap the field oxides 116 adjacent thereto. If not, the sink regions 111 and 112 may be exposed after patterning the polysilicon layer 118 due to misalignment, and high-dose impurity may be introduced into the sink regions 111 and 112 in a subsequent impurity implantation step, thereby potentially causing defects in the devices.

The polysilicon layer 118 is then etched by using the photoresist pattern 216 as an etch mask to form the emitter poly 120, the collector poly 122, the base poly 124, the P-type resistor 126, the N-type resistor 128, and the polysilicon pattern 130. The emitter poly 120 is formed near the center of the vertical region V. The collector poly 122 contacts the collector region 111 of the vertical region V. The base poly 124 contacts the base region 112 of the lateral region L. The P-type resistor 126 is formed on the field oxide 116 at the boundary of the vertical region V. The N-type resistor 128 is formed on the field oxide 116 at the boundary between the vertical and the lateral regions V and L. The polysilicon pattern 130 is formed on the pad oxide layer 108 inside the lateral region L.

A P-type impurity, such as boron, is thereafter implanted or diffused into the epitaxial layer 106 using the photoresist pattern 216 as a mask. In one example embodiment, the implantation dose may be about $1.0-5.0 \times 10^{15}$ atoms/cm$^2$ and the implantation energy may be about 40 keV. It is noted that a separate lithography step for an extrinsic base region is not required.

As shown in FIG. 2M, an insulating layer 142 is deposited after removing the photoresist pattern 216. The insulating layer 142 may be formed of silicon oxide or other suitable insulative material. The structure is then subjected to heat treatment for about 30–60 minutes at about 1,000–1,050° C.

The heat treatment forms the N-type emitter region 136 under the emitter poly 120 of the vertical region V, the P-type intrinsic base region 132 under the emitter region 136, the P-type extrinsic base region 134 at the sides of the intrinsic base region 132, the P-type emitter region 138 near the center of the lateral region L, and the P-type collector region 140 surrounding the emitter region 138. During the heat treatment, although boron and arsenic may be diffused simultaneously into the epitaxial layer 106, the diffusion rate of boron is generally faster than that of arsenic and, thus, the intrinsic base region 132 becomes located below the emitter region 136.

As shown in FIG. 2N, a photoresist pattern 218 is formed on the insulating layer 142. The insulating layer 142 and the pad oxide layer 108 are then etched using the photoresist pattern 218 as an etch mask. The insulating layer 142 has contact holes En, Cn, Bp, Bn, and H exposing the emitter poly 120, the collector poly 122, the extrinsic base region 134, the base poly 124 and the polysilicon pattern 130, respectively. The insulating layer 142 and the pad oxide layer 108 have contact holes Ep and Cp exposing the emitter region 138 and the collector region 140, respectively.

Finally, as shown in FIG. 1, the photoresist pattern 218 is removed, and a conductor layer is deposited to fill the contact holes En, Cn, Bn, Ep, Cp, and H. A photoresist pattern (not shown) is formed on the conductor layer. The conductor layer is then etched using the photoresist pattern to form emitter, base, and collector electrodes 144, 146, and 148 of the vertical region V connected to the emitter poly 120, the extrinsic base region 134, and the collector poly 122, respectively. The etching of the conductor layer also forms emitter, base, and collector electrodes 150, 152, and 154 of the lateral region L connected to the emitter region 138, the base poly 124, and the collector region 140 and the polysilicon pattern 130, respectively.

A semiconductor device and a manufacturing method thereof according to another embodiment will be described with reference to FIGS. 3 and 4A–4I.

Figure 3:
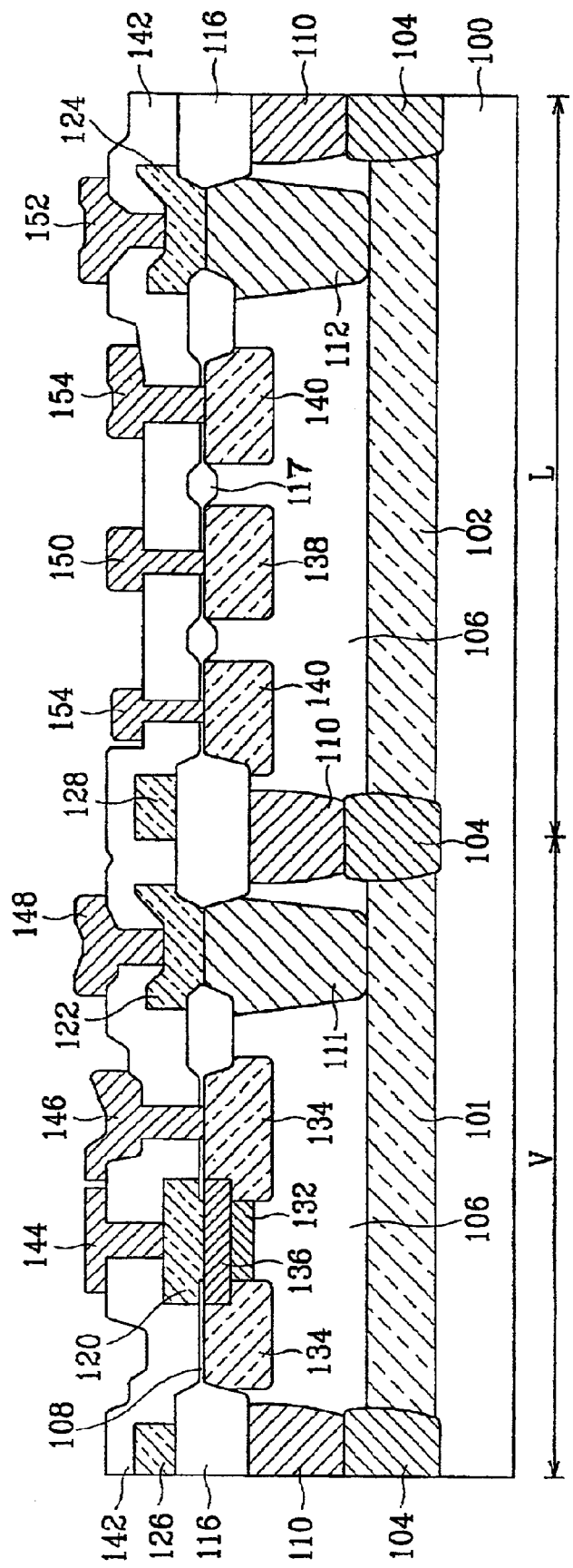
FIG. 3 is a sectional view of a semiconductor device according to another embodiment.

The embodiment of FIG. 3 is identical to that of FIG. 1, except as follows. The embodiment of FIG. 3 includes a pad oxide layer 108 in the vertical region V and a field oxide 117 in the lateral region L, which do not exist in the embodiment of FIG. 1. Moreover, the embodiment of FIG. 3 does not include the polysilicon pattern 130 shown in the embodiment of FIG. 1.

In the embodiment of FIG. 3, the pad oxide layer 108 on the surface of an epitaxial layer 106 in the vertical region V covers an emitter region 136 and an extrinsic region 134. The pad oxide layer 108 of FIG. 3 also has a contact hole exposing a portion of the emitter region 136 for electrical contact with an emitter electrode 120 of polysilicon. The pad oxide layer 108 in the vertical region V also has a contact hole along with an insulating layer 142, the contact hole exposing a portion of an extrinsic base region 134. The field oxide 117 on the epitaxial layer 106 in the lateral region L is located between an emitter region 138 and the collector region 140.

Now, the manufacturing method of the semiconductor device shown in FIG. 3 is described with reference to FIGS. 4A–4I. As with the embodiment of FIGS. 1 and 2A–2N, this method includes only ten (10) photolithography steps.

Figure 4A:
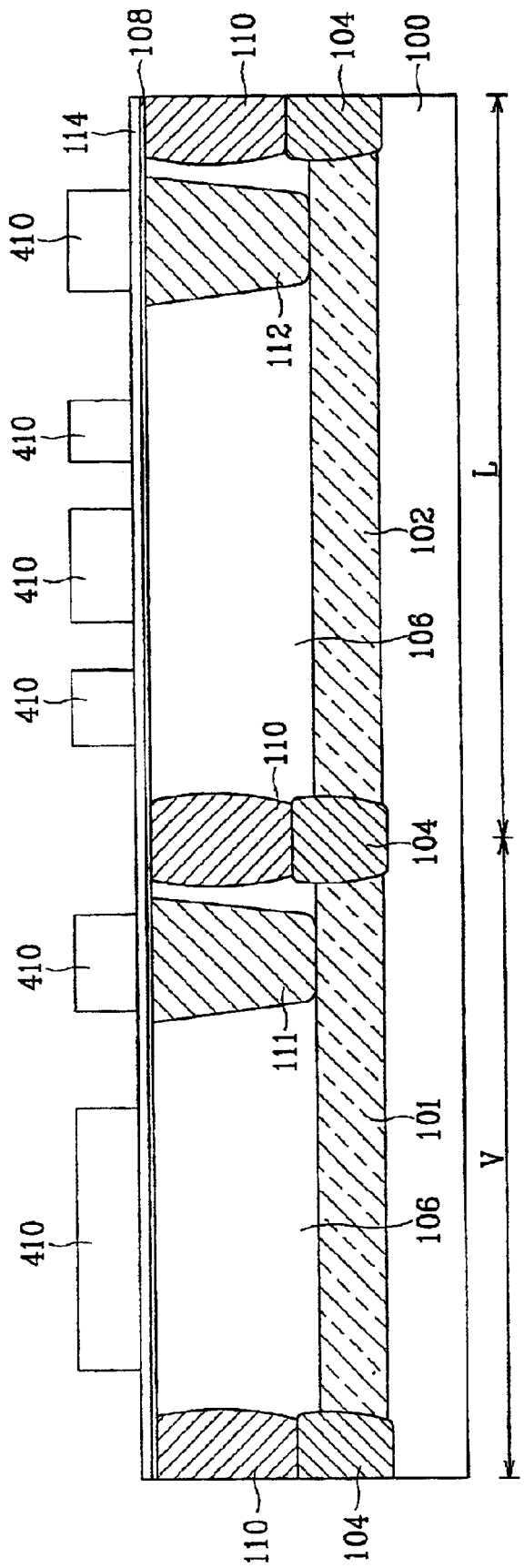

As shown in FIG. 4A, a photoresist pattern 410 is formed on a structure formed by the process shown in FIGS. 2A–2E. The photoresist pattern 410 has openings exposing portions of the pad oxide layer 108 at the boundaries of the sink regions 111 and 112 and at the boundaries of the vertical and the lateral regions V as the photoresist pattern 210 in the embodiment of FIG. 1. In addition, the photoresist pattern 410 has an opening at a position inside the lateral region L. The openings of the photoresist pattern 410 are located at the place where the field oxides 116 and 117 (FIG. 3) will be formed.

Figure 4B:
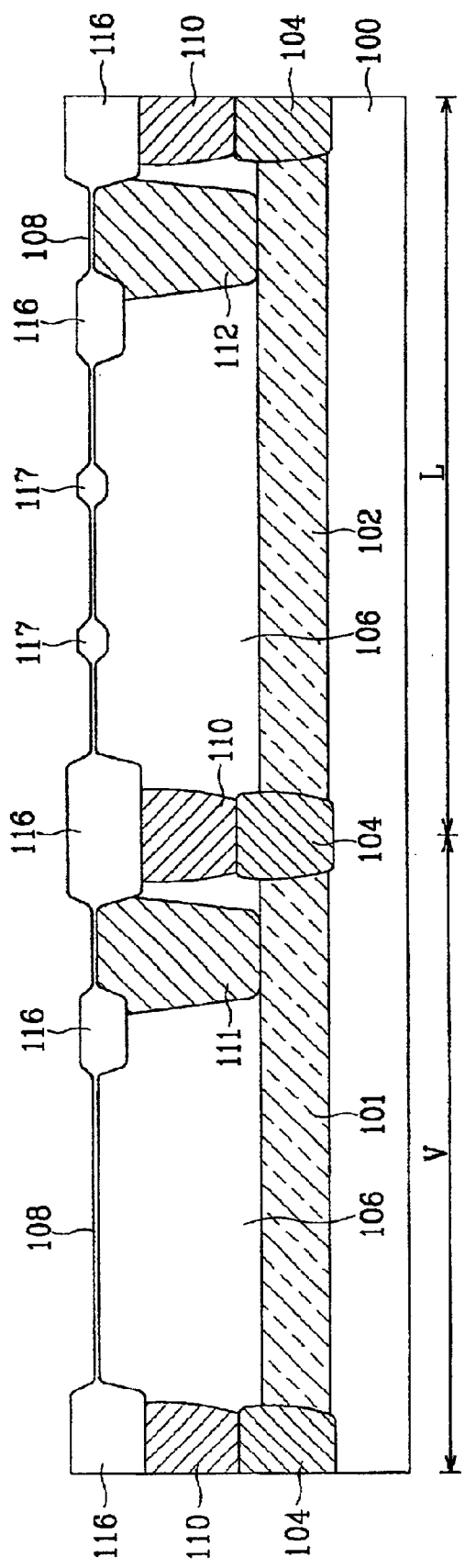

As shown in FIG. 4B, the nitride layer 114 is etched by using the photoresist pattern 210 as an etch mask. The photoresist pattern 210 is then removed. Thereafter, a plurality of field oxides 116 and 117 are formed using LOCOS (local oxidation of silicon). The nitride layer 114 is then removed. Instead of using LOCOS, trench processes may alternatively be used.

Figure 4C:
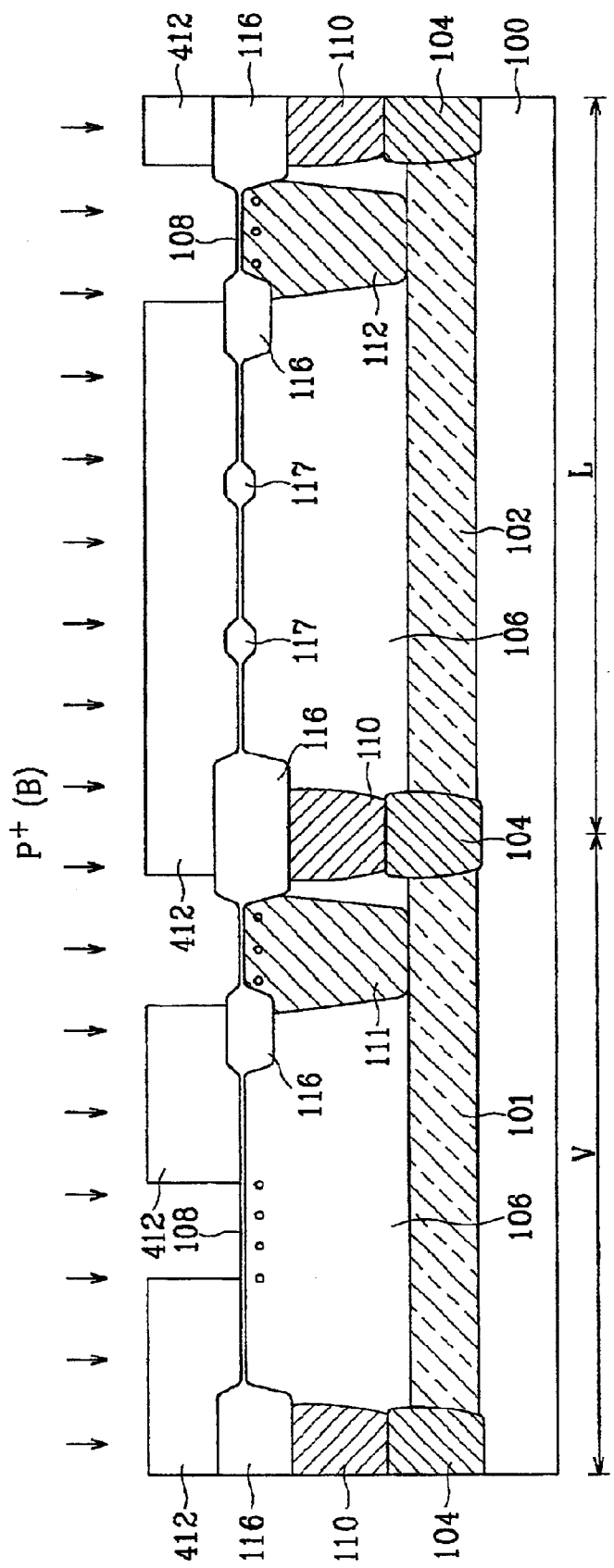

As shown in FIG. 4C, a photoresist pattern 412 is formed on the pad oxide layer 108 and the field oxides 116 and 117. The photoresist pattern 412 has openings exposing portions of the pad oxide layer 108 on the sink regions 111 and 112 and exposing a portion where an intrinsic base region 132 (FIG. 3) will be formed. Thus, the shape of the opening in the vertical region V in this step is different from that in the embodiment of FIG. 1. A P-type impurity is then implanted into the epitaxial layer 106 as in the embodiment of FIG. 1.

Figure 4D:
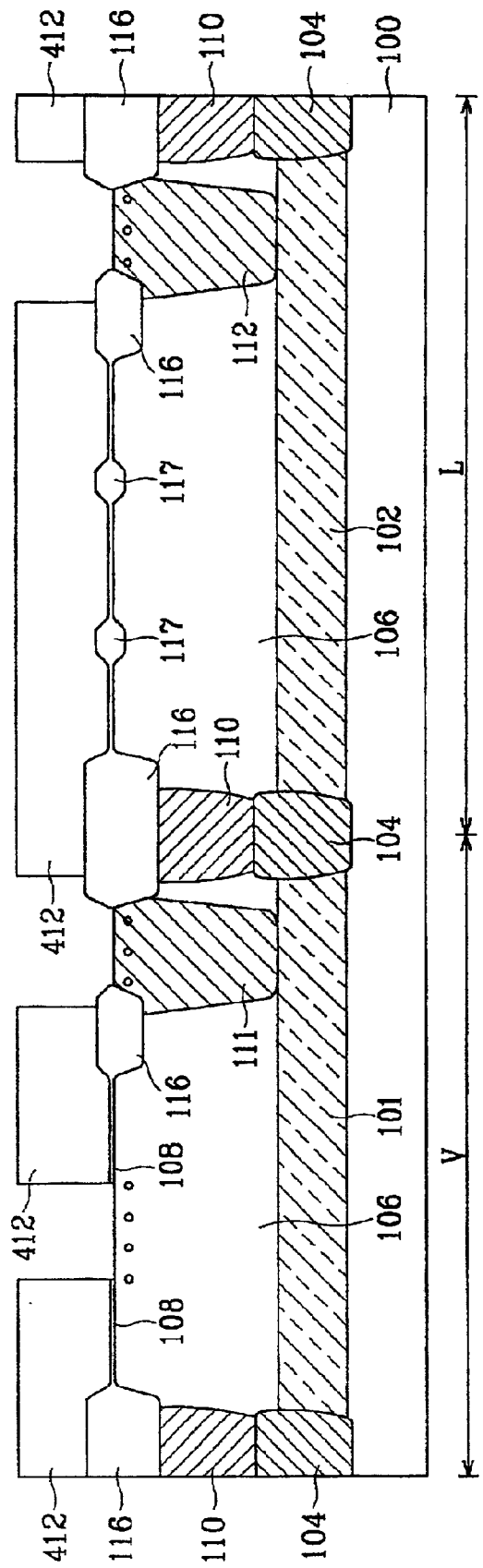

As shown in FIG. 4D, the pad oxide layer 108 is etched using the photoresist pattern 211 as an etch mask to remove portions of the pad oxide layers 108 on the sink regions 111 and 112 and to form a contact hole exposing a portion of the epitaxial layer 106 in the vertical region V.

After depositing a polysilicon layer 118, P-type and N-type impurities are implanted or diffused into the polysilicon layer 118 as illustrated in FIGS. 2J and 2K and described above.

A photoresist pattern 216 is next formed on the polysilicon layer 118, and the polysilicon layer 118 is patterned to form emitter, base and collector electrodes 120, 124 and 122, respectively, and resistors 126 and 128. The width of the emitter electrode 120 and the portion of the photoresist pattern 416 are shown as being larger than that of the contact hole thereunder to account for potential misalignment.

Finally, the semiconductor device shown in FIG. 3 is obtained through the steps substantially the same as those shown in FIGS. 2M and 2N and described above, without the polysilicon pattern 130 and the contact holes H.

FIG. 5 shows the concentration distribution (in log scale) along a vertical line passing the center of an emitter region of an example vertical NPN bipolar transistor manufactured by one embodiment of the present method. It may be understood from FIG. 5 that a semiconductor device manufactured by the present method operates normally.

In the drawings and foregoing description, there have been disclosed example embodiments, although specific terms are employed, they are used in an illustrative and descriptive sense only and not for purposes of limitation, the scope of the invention being set forth in the following claims.

What is claimed is:

1. A method for manufacturing a semiconductor device comprising:

forming a collector region of a first conductivity type in a semiconductor body of the first conductivity type;

depositing a polysilicon layer on the semiconductor body;

introducing a first dose of a first impurity of a second conductivity type into the polysilicon layer;

introducing a second dose of a second impurity of the first conductivity type into the polysilicon layer, the second dose being greater than the first dose;

patterning the polysilicon layer to form a collector poly electrically connected to the collector region and an emitter poly spaced apart from the collector poly; and heat treating the semiconductor body having the collector poly and the emitter poly thereon to form an emitter region of the first conductivity type adjacent the emitter poly and a base region off the second conductivity type adjacent the emitter region.

2. The method of claim 1, further comprising introducing a third impurity of the second conductivity type into the semiconductor body after forming the emitter poly and before the heat treatment, thereby forming an extrinsic base region after the heat treatment.

3. The method of claim 1, wherein the patterning further comprises:

forming a photoresist pattern on the polysilicon layer;

etching the polysilicon layer using the photoresist pattern as an etch mask;

introducing a third impurity of the second conductivity type into the semiconductor body by using the photoresist pattern as a mask, thereby forming an extrinsic base region after the heat treatment.

4. The method of claim 1, wherein diffusion rate of the first impurity is larger than diffusion rate of the second impurity.

5. The method of claim 1, wherein the semiconductor body comprises an epitaxial layer and a buried layer of the first conductivity type connected to the collector region.

6. The method of claim 1, further comprising introducing a third impurity of the second conductivity type into the semiconductor body before depositing the polysilicon layer.

7. The method of claim 1, further comprising:

forming a pad layer on the semiconductor body before forming the collector region; and forming a first contact hole through the pad layer exposing at least a portion of the collector region and forming a second contact hole through the pad layer exposing at least a portion of the epitaxial layer before depositing the polysilicon layer, thereby causing the polysilicon layer to contact the epitaxial layer through the first and the second contact holes.

8. The method of claim 7, further comprising introducing a third impurity of the second conductivity type into the semiconductor body before depositing the polysilicon layer.

9. The method of claim 1, further comprising:

forming a pad layer on the semiconductor body before forming the collector region; and removing the pad layer before depositing the polysilicon layer.

10. The method of claim 9, further comprising introducing a third impurity of the second conductivity type into the semiconductor body before depositing the polysilicon layer.

11. The method of claim 1, wherein the second dose is $1.0$–$5.0 \times 10^{14}$ atoms/cm$^2$ and the first dose is $9.0 \times 10^{15}$–$1.0 \times 10^{16}$ atoms/cm$^2$.

12. The method of claim 1, wherein the polysilicon layer has a first portion which is not subject to the introduction of the second impurity, and the first portion of the polysilicon layer is separated from both the emitter poly and the collector poly to become a resistor of the second conductivity type after the patterning of the polysilicon layer.

13. A method for manufacturing a semiconductor device comprising:

forming a collector region of a first conductivity type in a semiconductor body of the first conductivity type;

depositing a polysilicon layer on the semiconductor body;

forming a photoresist pattern on the polysilicon layer;

etching the polysilicon layer to form an emitter poly by using the photoresist pattern as an etch mask;

introducing first impurity of a second conductivity type for an extrinsic base region into the semiconductor body by using the photoresist pattern a mask;

removing the photoresist pattern; and forming an emitter region of the first conductivity type, an intrinsic base region of the second conductivity type under the emitter region, the extrinsic base region being connected to the intrinsic base region.

14. The method of claim 13, further comprising:

introducing a second impurity of the second conductivity type into at least a first portion of the polysilicon layer before forming the photoresist pattern; and introducing a third impurity of the first conductivity type into the polysilicon layer except for at least the first portion of the polysilicon layer before forming the photoresist pattern, wherein the etching further forms a resistor of the first portion of the polysilicon layer separated from the emitter poly.

15. A method for manufacturing a semiconductor device comprising:

forming a collector region, of first conductivity type in a semiconductor body of the first conductivity type;

depositing a polysilicon layer on the semiconductor body;

introducing an impurity of second conductivity type into the polysilicon layer without using photolithography;

forming a photoresist pattern covering at least one portion of the polysilicon layer;

introducing impurity of the first conductivity type into the polysilicon layer by using the photoresist pattern as a mask;

removing the photoresist pattern; and patterning the polysilicon layer to form a collector poly and an emitter poly of the first conductivity type and a resistor of the second conductivity type which are spaced apart from one another.

16. A method of manufacturing a semiconductor device comprising:

forming a first sink region in a vertical region of a semiconductor body having an insulating layer thereon and a second sink region in a lateral region of the semiconductor body;

forming a first photoresist pattern on the insulating layer, the first photoresist pattern having openings exposing portions of the insulating layer;

etching the insulating layer by using the first photoresist pattern;

depositing a polysilicon layer;

introducing an impurity of a second conductivity type with a first dose into the polysilicon layer without any lithography mask;

forming a second photoresist pattern covering a portion of the polysilicon layer;

introducing impurity of a first conductivity type with a second dose higher than the first dose into the polysilicon layer using the second photoresist pattern as a mask;

forming a third photoresist pattern after removing the second photoresist pattern;

etching the polysilicon layer by using the third photoresist pattern as an etch mask to form first, second, and emitter polys and a first resistor of the first conductivity type and a second resistor of the second conductivity type, the first and the second polys contacting the first and the second sink regions, respectively;

introducing impurity of the second conductivity type into the semiconductor body using the third photoresist pattern a mask; and heat treating the semiconductor body to form an emitter region of the first conductivity type, an intrinsic base region of the second conductivity type, and an extrinsic base region of the second conductivity type.

17. The method of claim 16, further comprising introducing impurity of the second conductivity type for the intrinsic base region into the semiconductor body using the first photoresist pattern as a mask.

* * * * *